United States Patent
Alpert et al.

(10) Patent No.: US 7,549,137 B2
(45) Date of Patent: Jun. 16, 2009

(54) LATCH PLACEMENT FOR HIGH PERFORMANCE AND LOW POWER CIRCUITS

(75) Inventors: Charles J. Alpert, Cedar Park, TX (US); Shyam Ramji, Fishkill, NY (US); Chin Ngai Sze, Austin, TX (US); Paul G. Villarrubia, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 224 days.

(21) Appl. No.: 11/610,567

(22) Filed: Dec. 14, 2006

(65) Prior Publication Data

US 2008/0148203 A1 Jun. 19, 2008

(51) Int. Cl.
*G06F 17/50* (2006.01)

(52) U.S. Cl. .................. 716/6; 716/10; 716/11

(58) Field of Classification Search .............. 716/6, 716/10, 11
See application file for complete search history.

(56) References Cited

U.S. PATENT DOCUMENTS

| 6,440,780 | B1 | 8/2002 | Kimura et al. |
| 6,442,739 | B1 | 8/2002 | Palermo et al. |
| 6,920,625 | B2 | 7/2005 | Gass |
| 7,020,861 | B2 | 3/2006 | Alpert et al. |
| 2006/0090153 | A1* | 4/2006 | Ho et al. ................. 716/11 |
| 2006/0095879 | A1* | 5/2006 | Brahme et al. ............ 716/6 |

OTHER PUBLICATIONS

Y. Lu et al., "Navigating Registers in Placement for Clock Network Minimization," ACM Design Automation Conference pp. 176-181 (Jun. 2005).
R. Puri et al., "Keeping Hot Chips Cool," ACM Design Automation Conference pp. 285-288 (Jun. 2005).
G. Venkataraman et al., "Integrated Placement and Skew Optimization for Rotary Clocking," European Design Automation Association (2006).
N. Venkateswaran et al., "Clock-Skew Constrained Placement for Row Based Designs," International Conference of Computer Design (1998).

* cited by examiner

*Primary Examiner*—Stacy A Whitmore
*Assistant Examiner*—Magid Y Dimyan
(74) *Attorney, Agent, or Firm*—Casimer K. Salys; Jack V. Musgrove (57) ABSTRACT

A novel iterative latch placement scheme wherein the latches are gradually pulled by increasing attraction force until they are eventually placed next to a clock distribution structure such as a local clock buffer (LCB). During the iterations, timing optimizations such as gate sizing and re-buffering are invoked in order to keep the timing estimation accurate. By applying the iterative clock net weighting adjustment, the present invention allows tighter interaction between logic placement and clock placement which leads to higher quality timing and significant power savings.

12 Claims, 6 Drawing Sheets

LATCH PLACEMENT FOR HIGH PERFORMANCE AND LOW POWER CIRCUITS

BACKGROUND OF THE INVENTION

1. Field of the Invention

The present invention generally relates to the fabrication and design of semiconductor chips and integrated circuits, and more particularly to a method of designing the physical layout (placement) of latches and other logic cells which receive clock signals from a clock distribution structure such as a local clock buffer.

2. Description of the Related Art

Integrated circuits are used for a wide variety of electronic applications, from simple devices such as wristwatches to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements grouped to perform a logic function. Cell types include, for example, core cells, scan cells and input/output (I/O) cells. Each of the cells of an IC may have one or more pins, each of which in turn may be connected to one or more other pins of the IC by wires. The wires connecting the pins of the IC are also formed on the surface of the chip. For more complex designs, there are typically at least four distinct layers of conducting media available for routing, such as a polysilicon layer and three metal layers (metal-1, metal-2, and metal-3). The polysilicon layer, metal-1, metal-2, and metal-3 are all used for vertical and/or horizontal routing.

An IC chip is fabricated by first conceiving the logical circuit description, and then converting that logical description into a physical description, or geometric layout. This process is usually carried out using a "netlist," which is a record of all of the nets, or interconnections, between the cell pins. A layout typically consists of a set of planar geometric shapes in several layers. The layout is then checked to ensure that it meets all of the design requirements, particularly timing requirements. The result is a set of design files known as an intermediate form that describes the layout. The design files are then converted into pattern generator files that are used to produce patterns called masks by an optical or electron beam pattern generator. During fabrication, these masks are used to pattern a silicon wafer using a sequence of photolithographic steps. The process of converting the specifications of an electrical circuit into a layout is called the physical design.

Cell placement in semiconductor fabrication involves a determination of where particular cells should optimally (or near-optimally) be located on the surface of a integrated circuit device. Due to the large number of components and the details required by the fabrication process for very large scale integrated (VLSI) devices, physical design is not practical without the aid of computers. As a result, most phases of physical design extensively use computer-aided design (CAD) tools, and many phases have already been partially or fully automated. Automation of the physical design process has increased the level of integration, reduced turn around time and enhanced chip performance. Several different programming languages have been created for electronic design automation (EDA) including Verilog, VHDL and TDML. A typical EDA system receives one or more high level behavioral descriptions of an IC device, and translates this high level design language description into netlists of various levels of abstraction.

Placement algorithms are typically based on either a simulated annealing, top-down cut-based partitioning, or analytical paradigm (or some combination thereof). Recent years have seen the emergence of several new academic placement tools, especially in the top-down partitioning and analytical domains. The advent of multilevel partitioning as a fast and extremely effective algorithm for min-cut partitioning has helped spawn a new generation of top-down cut-based placers. A placer in this class partitions the cells into either two (bisection) or four (quadrisection) regions of the chip, then recursively partitions each region until a global (coarse) placement is achieved. Analytical placers may allow cells to temporarily overlap in a design. Legalization is achieved by removing overlaps via either partitioning or by introducing additional forces and/or constraints to generate a new optimization problem. The classic analytical placers, PROUD and GORDIAN, both iteratively use bipartitioning techniques to remove overlaps. Eisenmann's force-based placer uses additional forces besides the well-known wire length dependent forces to reduce cell overlaps and to consider the placement area. Analytical placers optimally solve a relaxed placement formulation, such as minimizing total quadratic wire length. Quadratic placers generally use various numerical optimization techniques to solve a linear system. Two popular techniques are known as conjugate gradient (CG) and successive over-relaxation (SOR). The PROUD placer uses the SOR technique, while the GORDIAN placer employs the CG algorithm.

While these techniques provide adequate placement of cells with regard to their data interconnections, there is an additional challenge for the designer in constructing a clock network for the cells and this challenge is becoming more difficult with the latest technologies like low-power, 65-nanometer integrated circuits. Low power circuits (e.g., around 20 watts or less for microprocessor chips) are becoming more prevalent due to power consumption problems. In particular, power dissipation has become a limiting factor for the yield of high-performance circuit designs (operating at frequencies around 1 gigahertz or more) with deep submicron technology. Clock nets can contribute up to 50% of the total active power in multi-GHz designs. Low power designs are also preferable since they exhibit less power supply noise and provide better tolerance with regard to manufacturing variations.

There are several techniques for minimizing power while still achieving timing objectives for high performance, low power systems. One method involves the use of local clock buffers (LCBs) to distribute the clock signals. A typical clock control system has a clock generation circuit (e.g., a phase-lock loop) that generates a master clock signal which is fed to a clock distribution network that renders synchronized global clock signals at the LCBs. Each LCB adjusts the global clock duty cycle and edges to meet the requirements of respective circuit elements, e.g., local logic circuits or latches (the term "latch" as used herein stands for any clocked element which is usually a sink of a clock distribution network). Since this clock network is one of the largest power consumers among all of the interconnects, it is further beneficial to control the capacitive load of the LCBs, each of which is driving a set of many clock sinks. One approach for reducing the capacitive load is latch clustering, i.e., clusters of latches placed near the respective LCB of their clock domain. Latch clustering combined with LCBs can significantly reduce the total clock wire capacitance which in turn reduces overall clock power consumption. Since most of the latches are placed close to an LCB, clock skew is also reduced which helps improve the timing of the circuit.

Figure 1:
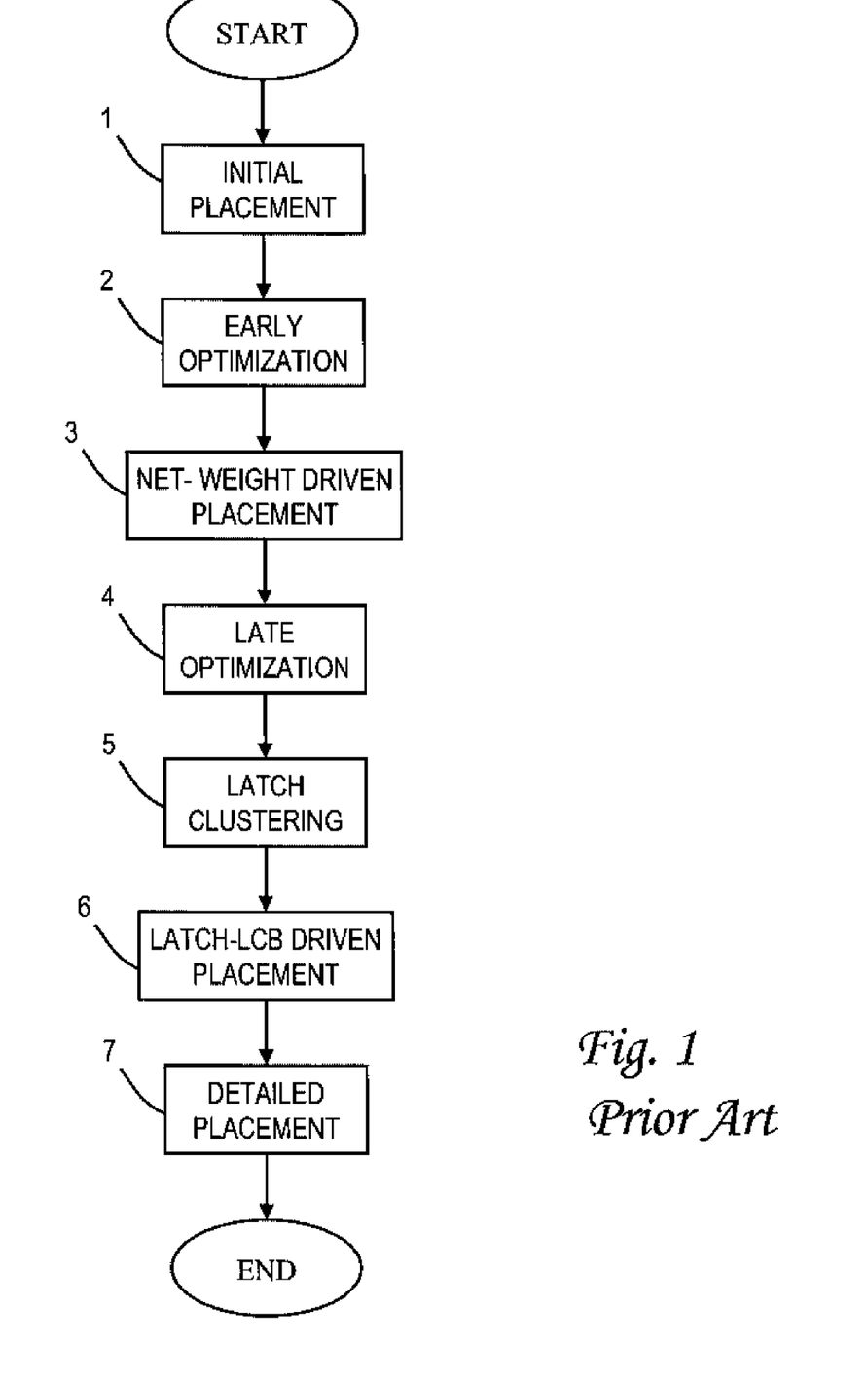
FIG. 1 is a chart illustrating the logical flow for a conventional latch placement technique with clock optimization followed by latch-LCB driven placement.

Conventional placement with LCBs and latch clustering is illustrated in the flow chart of FIG. 1. The process begins with an initial placement based on an input layout for the circuit (1). The input layout can be provided by an EDA tool, or can simply be a random layout for the circuit elements. The initial placement locates all circuit elements, including clock sinks, in a region of the integrated circuit using for example quadratic placement. Other placement techniques may be used but quadratic placement often produces better results than alternatives such as min-cut based placement. The quadratic placement portion of the process solves the linear system $Ax=b$ where A is an optimization matrix, and x and b are vectors. During quadratic placement, cells are recursively partitioned into smaller bins until a target number of objects per bin is reached, such as five objects per bin. For the initial placement, all wires (edges) have the same net-weighting. The timing of the circuit is then analyzed and adjusted in early optimization (2). This optimization may include gate re-sizing and buffer insertion using a grid system such as a 50×50 grid in which buffers are assigned to grid cells having lower logic densities. A weighted placement (3) follows which is similar to step 1, but in the weighted placement the input layout is the output of the early optimization step 2 and different weights are applied to different edges based on the timing constraints. The partitioning may also be finer for the weighted placement, e.g., recursively partitioning until there are around two objects per bin. The weighted placement is then followed by late optimization which provides different logic optimizations such as buffer insertion but at a finer (or sometimes the same) level, e.g., in a 100×100 grid (4). Late optimization may be the same as early optimization, the conceptual difference being that early optimization works on a circuit which is never processed by layout-driven optimization steps.

Steps 1 and 3 of FIG. 1 do not differentiate between latches and other (non-clocked) logic cells, so at first the latches are allowed to move freely according to placement tools driven by data path timing. In the following steps the process focuses on the latches only, i.e., latches that are part of one or more clock domains. Latches are grouped into a given cluster based on locality and clock domain (5). The LCB for a given clock domain is located at the centroid of the latch clusters, and the latches are pulled to the LCB (6). For this latch-LCB driven placement, the size of the LCBs is temporarily shrunk to the same width as a latch. A relatively high weighting (attraction) is applied to the interconnections between the latch and the LCB for this placement step, e.g., by a factor of 10 compared to the net weights of the most critical data paths. In this manner all latches will be placed next to the corresponding LCB, which is then readjusted back to its original size. The final step is detailed placement which refines the layout using for example min-cut placement or heuristic techniques (7).

The resulting LCB-latch structure is very large relative to other circuit elements involved in the placement process and greatly impacts the timing of the S circuit. The LCB itself occupies a particularly large area and the latches are constrained to be very close to the LCB. While this process has some advantages relative to the clock network, such restrictions seriously affect the flexibility of a placer and can often produce poor logic placement. It would, therefore, be desirable to devise an improved placement method which could reduce the disturbance to the placement process that is introduced by clustering latches around an LCB. It would be further advantageous if the method could balance logic placement and latch placement constraints to achieve higher quality timing.

SUMMARY OF THE INVENTION

It is therefore one object of the present invention to provide an improved placement method for designing the layout of an integrated circuit which takes the clock network into consideration and places latches belonging to different clock domains closer to their corresponding local clock buffer without sacrificing timing requirements.

It is another object of the present invention to provide such a method which improves timing while reducing clock power consumption.

It is yet another object of the present invention to provide an improved latch placement technique for high performance, low power circuits.

The foregoing objects are achieved in a method of designing a layout for latches in clock domains of an integrated circuit by optimizing an input layout of the latches and other circuit elements based on a timing constraint to produce an interim optimized layout, defining a location for a clock distribution structure of the clock domain such as a local clock buffer (LCB) based on the interim optimized layout, placing the latches around the clock distribution structure based on an attraction value while simultaneously placing other circuit elements to produce a new input layout, and iteratively repeating the optimizing, defining, and placing while successively increasing the attraction value. Latches are grouped into clusters based on clock domain and clustering scores that are a function of connection weighting for a given pair of objects and the sizes of those objects. An LCB target location for a given clock domain is established at the centroid of the latch clusters, and the latch clusters are pulled to the LCB by the increasing attraction force. In an exemplary implementation, the optimizing, defining, and placing are repeated a total of four iterations with relative attraction values of 9, 18, 36 and 300. The attraction value is used as a multiplicative factor for wirelength between a latch and the LCB. An increasing attraction value may also be used between the LCB itself and its corresponding target location.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 2:
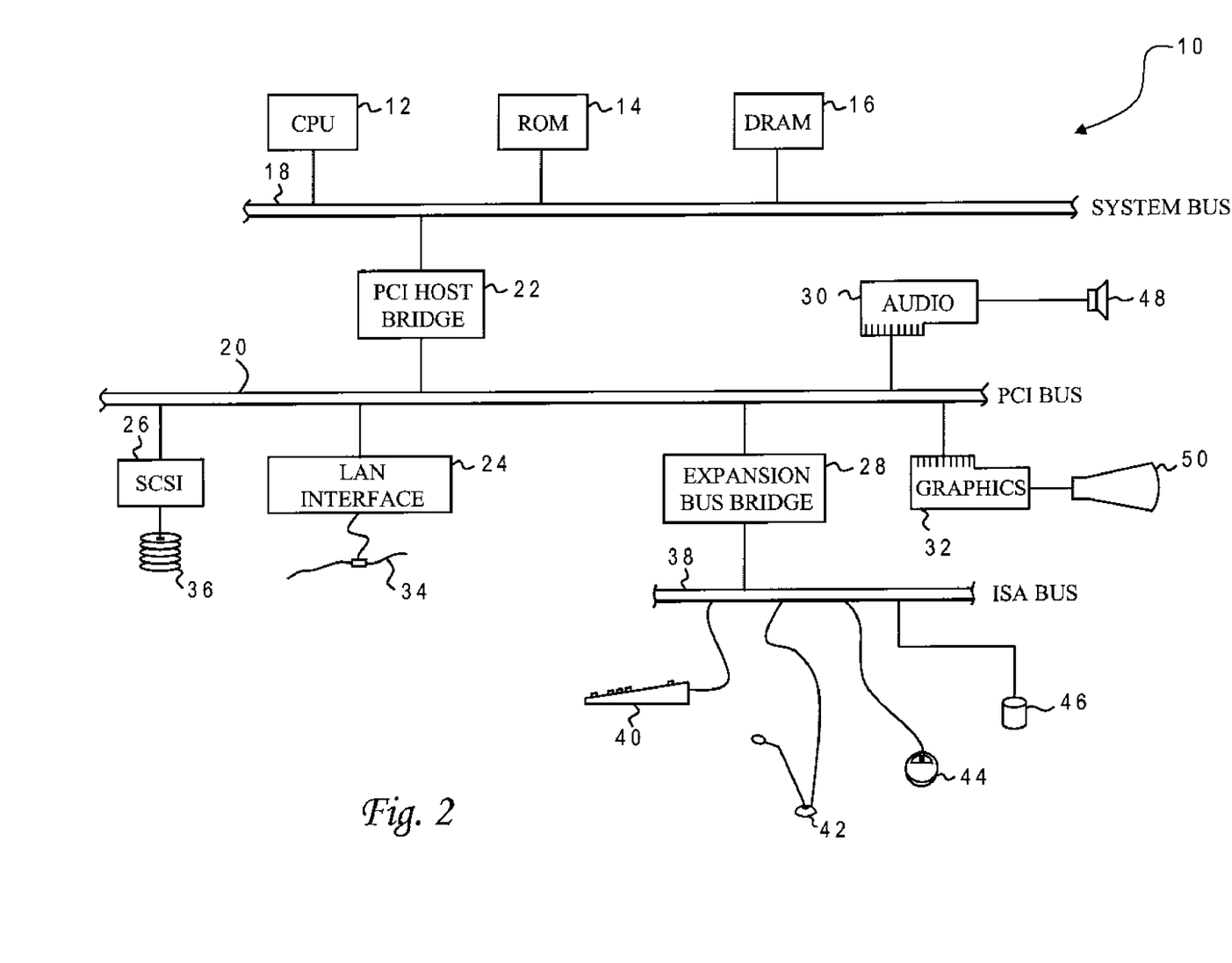
FIG. 2 is a block diagram of a computer system programmed to carry out computer-aided design of an integrated circuit in accordance with one implementation of the present invention.

With reference now to the figures, and in particular with reference to FIG. 2, there is depicted one embodiment 10 of a computer system programmed to carry out computer-aided design of an integrated circuit in accordance with one implementation of the present invention. System 10 includes a central processing unit (CPU) 12 which carries out program instructions, firmware or read-only memory (ROM) 14 which stores the system's basic input/output logic, and a dynamic random access memory (DRAM) 16 which temporarily stores program instructions and operand data used by CPU 12. CPU 12, ROM 14 and DRAM 16 are all connected to a system bus 18. There may be additional structures in the memory hierarchy which are not depicted, such as on-board (L1) and second-level (L2) caches. In high performance implementations, system 10 may include multiple CPUs and a distributed system memory.

CPU 12, ROM 14 and DRAM 16 are also coupled to a peripheral component interconnect (PCI) local bus 20 using a PCI host bridge 22. PCI host bridge 22 provides a low latency path through which processor 12 may access PCI devices mapped anywhere within bus memory or I/O address spaces. PCI host bridge 22 also provides a high bandwidth path to allow the PCI devices to access DRAM 16. Attached to PCI local bus 20 are a local area network (LAN) adapter 24, a small computer system interface (SCSI) adapter 26, an expansion bus bridge 28, an audio adapter 30, and a graphics adapter 32. LAN adapter 24 may be used to connect computer system 10 to an external computer network 34, such as the Internet. A small computer system interface (SCSI) adapter 26 is used to control high-speed SCSI disk drive 36. Disk drive 36 stores the program instructions and data in a more permanent state, including the program which embodies the present invention as explained further below. Expansion bus bridge 28 is used to couple an industry standard architecture (ISA) expansion bus 38 to PCI local bus 20. As shown, several user input devices are connected to ISA bus 38, including a keyboard 40, a microphone 42, and a graphical pointing device (mouse) 44. Other devices may also be attached to ISA bus 38, such as a CD-ROM drive 46. Audio adapter 30 controls audio output to a speaker 48, and graphics adapter 32 controls visual output to a display monitor 50, to allow the user to carry out the integrated circuit design as taught herein.

While the illustrative implementation provides the program instructions embodying the present invention on disk drive 36, those skilled in the art will appreciate that the invention can be embodied in a program product utilizing other computer-readable media.

Computer system 10 carries out program instructions for placement of clock sinks in the design of an integrated circuit using a novel technique wherein the sinks are preferably initially placed and optimized by conventional methods and thereafter are iteratively placed and optimized with increasing latch-LCB attraction values as explained further below. Accordingly, a program embodying the invention may include conventional aspects of various quadratic optimizers, cut-based partitioners and buffer insertion tools, and these details will become apparent to those skilled in the art upon reference to this disclosure. Although these clock sinks are referred to herein as latches, that term includes devices such as flip-flops, dynamic logic circuits, or any combination of these and other clocked circuit elements.

In one implementation computer system 10 begins the design process using the initial placement, early optimization, weighted placement, late optimization and latch clustering steps (1-5) as described in conjunction with FIG. 1. The input data (netlist) includes clock domain information, and prior to initial placement the design is clock traced to assign latches to their respective domain groups. In this regard, the term "clock domain" refers to any non-data signal that is used to gate a collection of sinks. The input data may also include gating source information for the domain group.

Figure 3A:
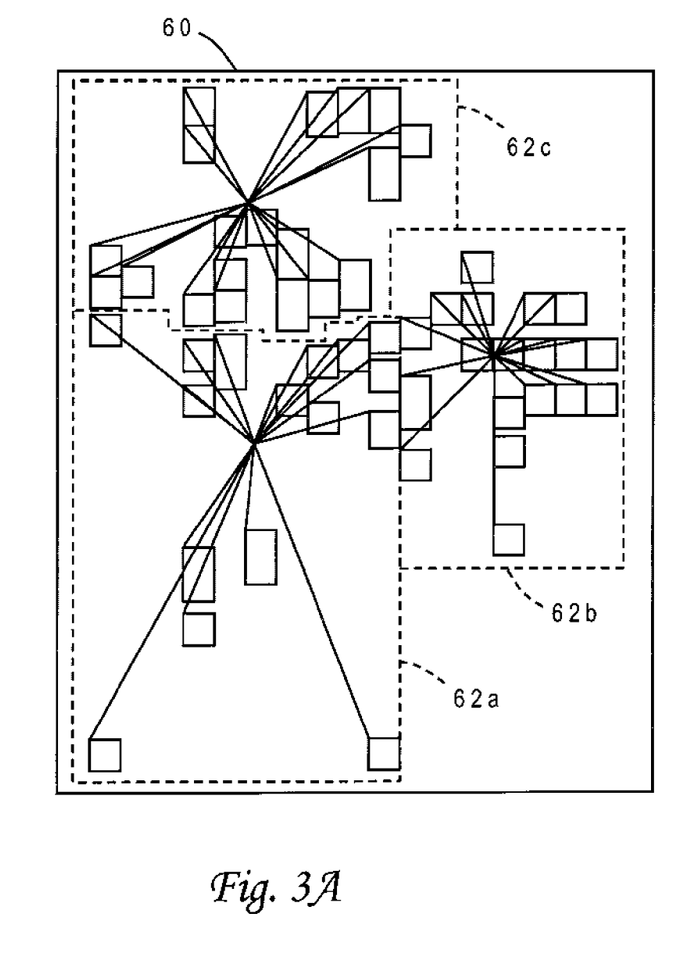
FIGS. 3A-3F are plan views for layouts of an integrated circuit having latches in three clock domains which are iteratively optimized and placed in accordance with one implementation of the present invention.

Latch clustering may be carried out using various known clustering strategies. The present invention preferably groups objects (latches or logic cells) into clusters based on clock domain and clustering scores that are a function of connection weighting for a given pair of objects and the sizes of those objects, as more fully described in U.S. patent application Ser. No. 10/996,293 filed Nov. 22, 2004, which is hereby incorporated. One example of a resulting layout 60 is shown in FIG. 3A. In this simplified example, there are 54 latch clusters (solid boxes) each located in one of three different clock domains 62a, 62b, 62c. Those skilled in the art will appreciate that practical applications of the invention may involve hundreds or thousands of clock sinks with larger numbers of latch clusters and clock domains.

Figure 3B:
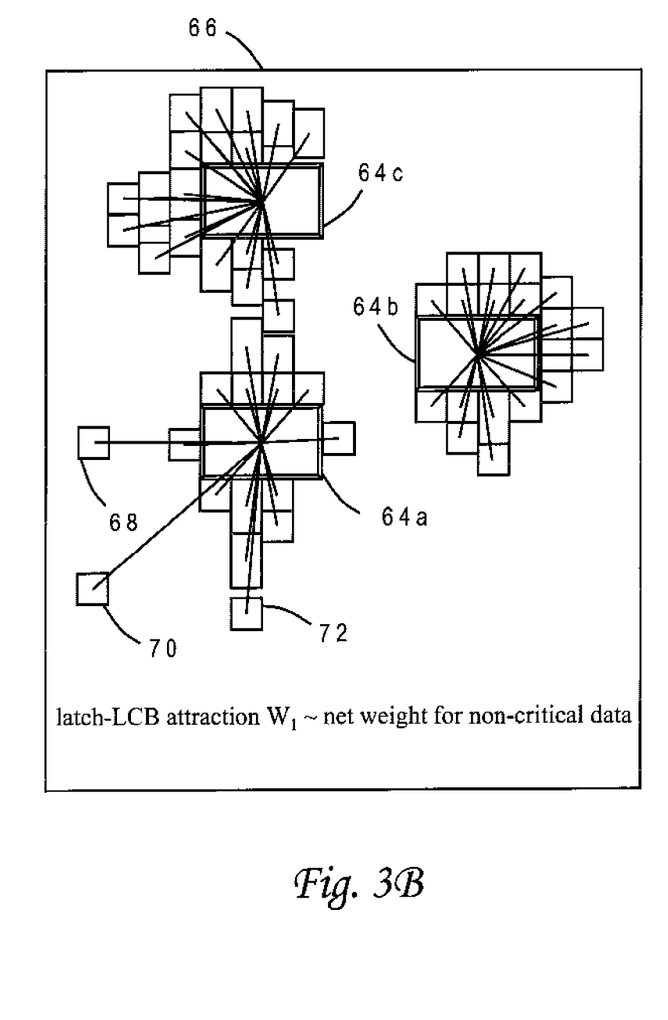

The process then iteratively places the latches based on successively increasing attraction to associated local clock buffers (LCBs), or other structures that may be used in the clock distribution network. During these iterations, timing optimizations (such as gate sizing and re-buffering) are invoked in order to keep the timing estimation accurate. The first iteration for latch-LCB driven placement is shown in FIG. 3B. LCB target locations are established at the centroids of the latch clusters for the respective clock domains 62a, 62b, 62c in the interim layout of FIG. 3A. For the first iteration, the latch-LCB attraction value ($W_1$) is set to around the same weight used for a non-critical net in the previous weighted placement, with a moderately higher attraction value set for the LCB itself to its corresponding target location. The latch-LCB attraction value and the LCB-target location attraction value are used as multiplicative factors in determining effective wire length for the placement. Actual wire length is measured from the center of a cluster to the center of its corresponding LCB. This latch-LCB driven placement pulls the latch clusters for a given clock domain closer together, surrounding the LCB, as can be seen from the overall tighter layout 66 of FIG. 3B as compared to FIG. 3A. The specific algorithm that carries out this latch-LCB driven placement may be any type of placer, preferably an analytical placer such as a quadratic placement tool which minimizes the overall weighted wire length between the latches and an LCB, and between the LCB and its target location.

Figure 3C:
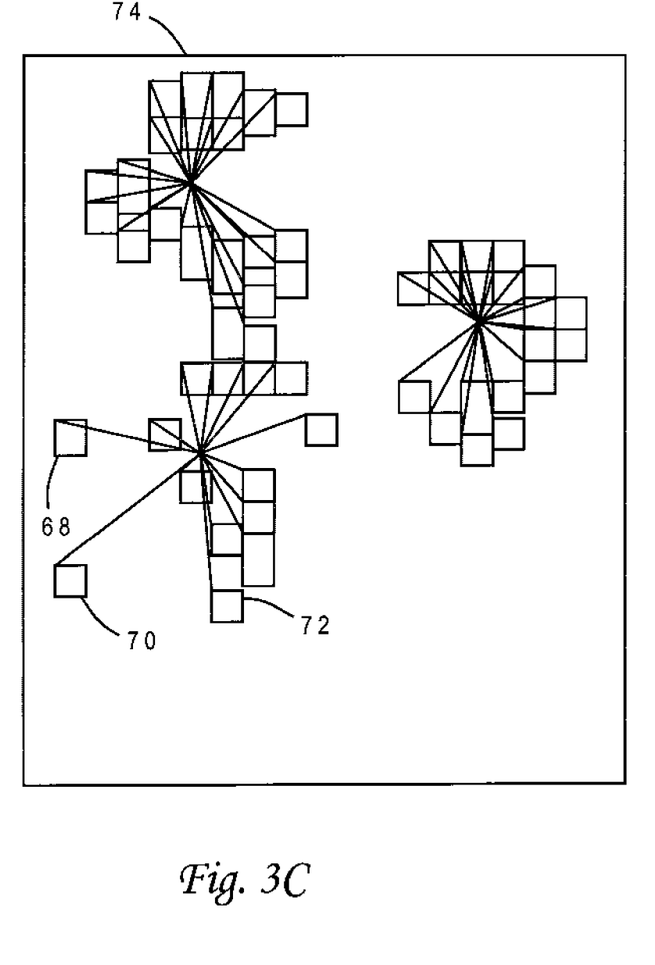

Even with this tighter latch-LCB placement, there still may be several latch clusters that are somewhat distant from the LCB, for example, clusters 68, 70 and 72 which are part of clock domain 62a and connect to LCB 64a. These outlying clusters can be brought closer to the LCB while maintaining timing requirements by re-optimizing the layout and gradually increasing the latch-LCB attraction, as well as the LCB-target location attraction, for subsequent iterations. FIG. 3C illustrates a layout 74 which results from further late optimization and re-clustering of layout 66. In this second (interim) optimized layout 74 many of the latch clusters are unchanged, but some latches have been grouped into different clusters and some clusters have moved slightly. Clusters 68, 70 and 72 are still relatively distant from the centroid of the latches in clock domain 62a. The latch clusters then undergo a second latch-LCB driven placement to arrive at the layout 76 of FIG. 3D.

Figure 3D:
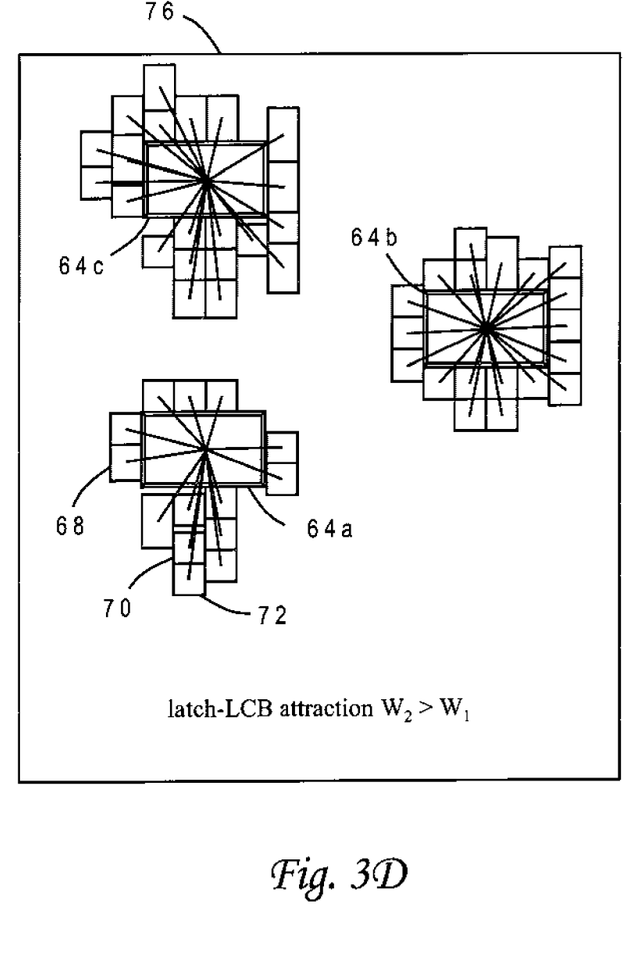

For this second iteration the latch-LCB attraction value ($W_2$) is slightly higher than the previous value used in the first iteration, and the LCB-target location attraction value is similarly increased. As can be seen, layout 76 pulls the clusters even closer to the LCBs and, in particular, clusters 68 and 70 are much closer although cluster 72 is still slightly distant.

Figure 3E:
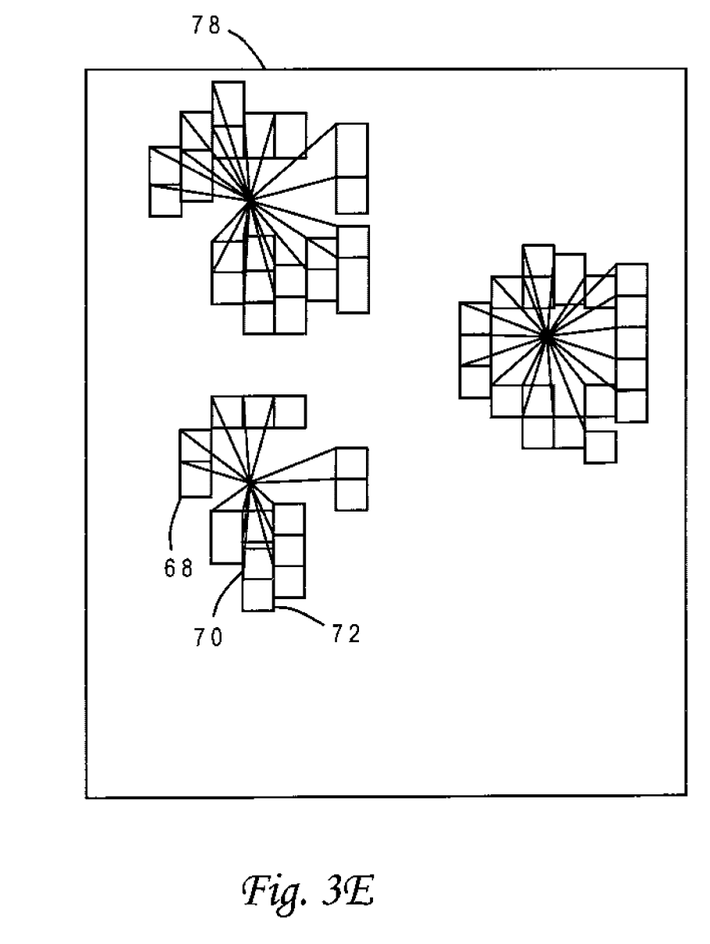
Figure 3F:
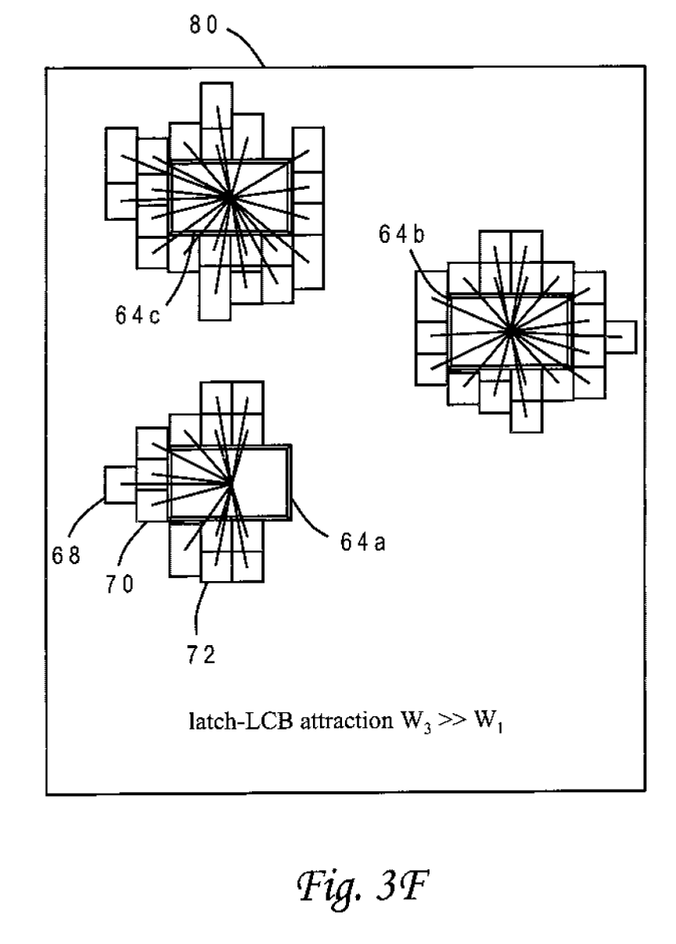

The re-optimizing, re-clustering, and latch-LCB driven placement is iteratively repeated according to the discretion of the designer who may set the number of iterations based on, for example, computation restrictions. The iterations can also be terminated when some timing target is met, or the timing improvement between consecutive iterations drops below a threshold value. A third iteration is illustrated in FIGS. 3E and 3F. Layout 78 in FIG. 3E results from further late optimization and re-clustering using layout 76 as an input. The latches may again be grouped differently, and the locations of some latch clusters have changed, along with the centroid of the latches for a given clock domain. Layout 78 is then used to re-locate LCBs 64a, 64b and 64c, followed by latch-LCB driven placement to arrive at the layout 80 of FIG. 3F. For the final iteration the latch-LCB attraction value ($W_3$) is significantly higher, as is the LCB-target location attraction value. In this final layout 80, all of the latch clusters are relatively close to their respective LCB, including clusters 68, 70 and 72.

The specific values for latch-LCB attraction during the different iterations may be selected by the designer based on the particular nuances of the circuit being designed. In the exemplary implementation there are four iterations of optimization followed by latch clustering and latch-LCB driven placement with successively increasing latch-LCB attraction values of 9, 18, 36, and 300, and successively increasing LCB-target location attraction values of 37, 111, 333, and 1000. These weights are applied only to the clock signal wiring from an LCB to a latch. In comparison, the relative weighting for data signal wiring might be in the range of 10-100, where 10 is the minimum value for positive slack and the most critical data connection is given a weighting of 100.

Figure 4:
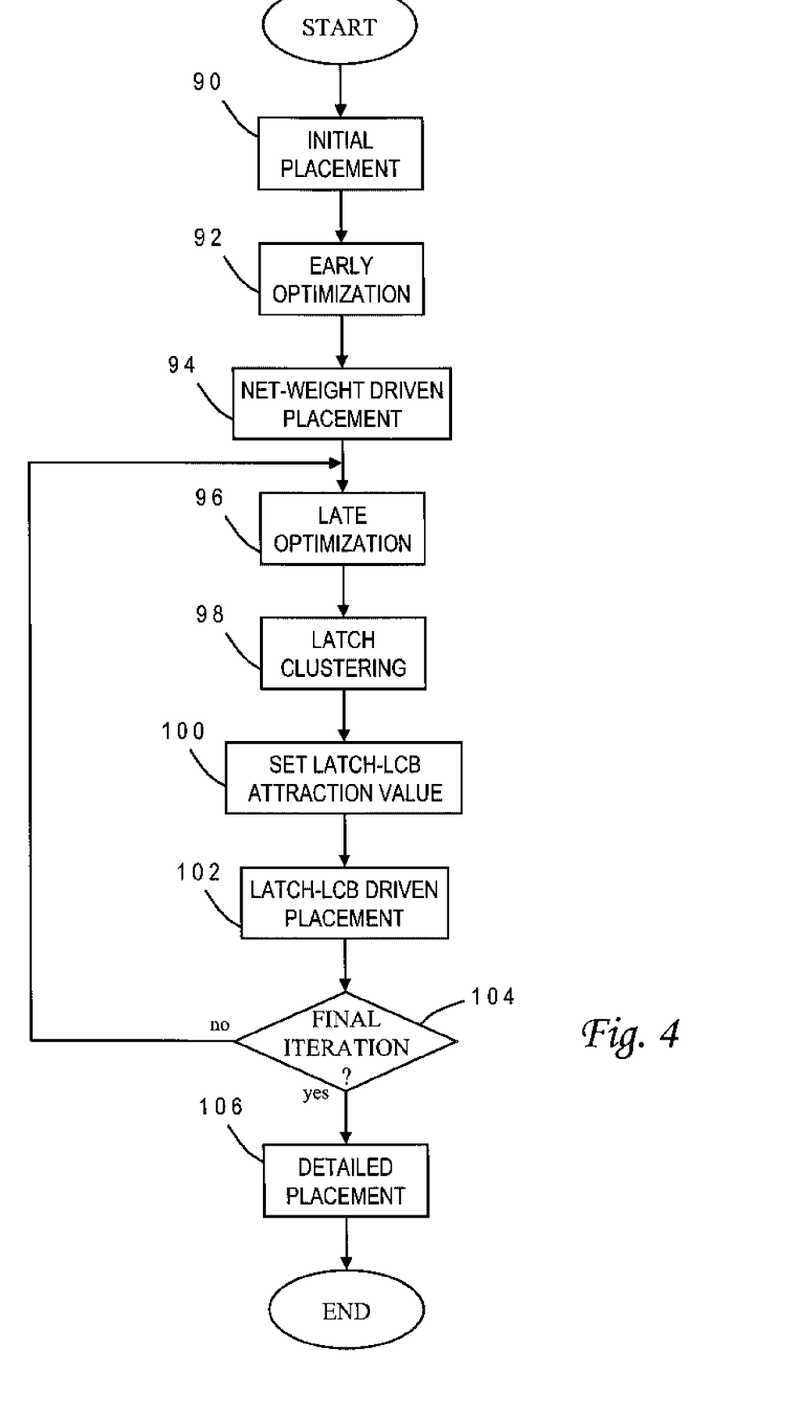
FIG. 4 is a chart illustrating the logical flow for one implementation of the present invention wherein clock optimization and latch-LCB driven placement are iteratively repeated with increasing latch-LCB attraction values.

The present invention may be further understood with reference to the chart of FIG. 4 which illustrates the logical flow according to one implementation. The process begins with an initial quadratic placement of the sinks in which they are recursively partitioned into smaller bins until five objects per bin is reached (90). For the initial placement, all wires (edges) have equal weighting. The timing of the circuit is then analyzed and adjusted in early optimization, including gate resizing and buffer insertion using a 10×10 grid in which buffers are assigned to grid cells having lower logic densities (92). A net-weight driven placement follows which is similar to the initial placement, but in the net-weight driven placement different weights are applied to different edges according to their criticality in meeting timing constraints, and the circuit elements are recursively partitioned until there are two objects per bin (94).

At this point the process enters an iterative loop which begins with late optimization that performs gate resizing and buffer insertion with a 100×100 grid (96). The latches are then clustered (98), and the latch-LCB attraction value is set based on the particular iteration (100). Latch-LCB driven placement follows, using the current latch-LCB attraction value (102). The late optimization, latch clustering, setting of the latch-LCB attraction value and latch-LCB driven placement are repeated for the designated number of iterations, with the output of the latch-LCB driven placement becoming a new input layout for the next iteration (104). These steps smoothly move the latches to an LCB by interleaving timing optimization and thereby avoid the adverse effects to timing that might otherwise arise from the excessively large latch-LOB structures. The final step is detailed placement which refines the layout using for example min-cut placement or heuristic techniques with a placer such as TIMBERWOLF (7).

In the prior art, clock tree synthesis is generally handled separately from the logic placement process. By applying the iterative clock net weighting adjustment, the present invention allows tighter interaction between logic placement and clock placement which leads to higher quality results (timing). The total capacitance on the local clock buffer is also reduced by as much as 25%, yielding significant power savings. Experimental results show that the present invention not only improves timing while reducing clock power, but also improves worst-case slack Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, the invention is not limited to use with quadratic placement only, and the placement steps can utilize other placement algorithms such as nonlinear optimization, force-directed, min-cut or simulated annealing. It is therefore contemplated that such modifications can be made without departing from the spirit or scope of the present invention as defined in the appended claims.

What is claimed is:

1. A method of designing a layout for a plurality of latches in a clock domain of an integrated circuit, comprising:
   optimizing an input layout of the latches based on a timing constraint to produce an interim optimized layout by executing first instructions on a computer system;
   defining a target location for a local clock buffer (LCB) of the clock domain at a centroid of the latches based on the interim optimized layout by executing second instructions on a computer system;
   placing the latches around the local clock buffer based on latch-LCB attraction value and based on an LCB-target location attraction value to produce a new input layout by executing third instructions on a computer system; and
   iteratively repeating said optimizing, defining, and placing while successively increasing the latch-LCB attraction value and the LCB-target location attraction value.

2. The method of claim 1, further comprising grouping the latches in the clock domain into clusters after said optimizing, wherein the latches are placed around the local clock buffer by placing the latch clusters.

3. The method of claim 1 wherein said optimizing, defining, and placing are repeated a total of four iterations with latch-LCB attraction values of 9, 18, 36 and 300.

4. The method of claim 1 wherein the latch-LCB attraction value is used as a multiplicative factor for wirelength between a latch and the local clock buffer in the placement of the latches around the local clock buffer.

5. A computer system comprising:
   one or more processors which process program instructions;
   a memory device connected to said one or more processors; and
   program instructions residing in said memory device for designing a layout for a plurality of latches in a clock domain of an integrated circuit by optimizing an input layout of the latches based on a timing constraint to produce an interim optimized layout, defining a target location for a local clock buffer (LCB) of the clock domain at a centroid of the latches based on the interim optimized layout, placing the latches around the local clock buffer based on a latch-LCB attraction value and based on an LCB-target location attraction value to produce a new input layout, and iteratively repeating said optimizing, defining, and placing while successively increasing the latch-LCB attraction value and the LCB-target location attraction value.

6. The computer system of claim 5 wherein said program instructions further group the latches in the clock domain into clusters after said optimizing, and the latches are placed around the local clock buffer by placing the latch clusters.

7. The computer system of claim 5 wherein said optimizing, defining, and placing are repeated a total of four iterations with latch-LCB attraction values of 9, 18, 36 and 300.

8. The computer system of claim 5 wherein the latch-LCB attraction value is used as a multiplicative factor for wirelength between a latch and the local clock buffer in the placement of the latches around the local clock buffer.

9. A computer program product comprising:

a computer-readable medium; and program instructions residing in said medium for designing a layout for a plurality of latches in a clock domain of an integrated circuit by optimizing an input layout of the latches based on a timing constraint to produce an interim optimized layout, defining a target location for a local clock buffer (LCB) of the clock domain at a centroid of the latches based on the interim optimized layout, placing the latches around the local clock buffer based on a latch-LCB attraction value and based on an LCB-target location attraction value to produce a new input layout, and iteratively repeating said optimizing, defining, and placing while successively increasing the latch-LCB attraction value and the LCB-target location attraction value.

10. The computer program product of claim 9 wherein said program instructions further group the latches in the clock domain into clusters after said optimizing, and the latches are placed around the local clock buffer by placing the latch clusters.

11. The computer system of claim 9 wherein said optimizing, defining, and placing are repeated a total of four iterations with latch-LCB attraction values of 9, 18, 36 and 300.

12. The computer system of claim 9 wherein the latch-LCB attraction value is used as a multiplicative factor for wirelength between a latch and the local clock buffer in the placement of the latches around the local clock buffer.

* * * * *